(12) United States Patent
Hekmatshoar-Tabari et al.

(10) Patent No.: US 10,043,934 B2
(45) Date of Patent: Aug. 7, 2018

(54) SILICON-CONTAINING HETEROJUNCTION PHOTOVOLTAIC ELEMENT AND DEVICE

(75) Inventors: Bahman Hekmatshoar-Tabari, Mount Kisco, NY (US); Devendra K. Sadana, Pleasantville, NY (US); Ghavam G. Shahidi, Round Ridge, NY (US); Davood Shahrjerdi, Ossining, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 716 days.

(21) Appl. No.: 13/156,009

(22) Filed: Jun. 8, 2011

(65) Prior Publication Data
US 2012/0312362 A1    Dec. 13, 2012

(51) Int. Cl.
*H01L 31/072*    (2012.01)
*H01L 31/18*    (2006.01)
*H01L 31/0747*    (2012.01)

(52) U.S. Cl.
CPC ...... *H01L 31/0747* (2013.01); *H01L 31/1804* (2013.01); *Y02E 10/547* (2013.01); *Y02P 70/521* (2015.11)

(58) Field of Classification Search
CPC ................. H01L 31/1804; H01L 31/1812
USPC ......................................... 136/261
See application file for complete search history.

(56) References Cited

U.S. PATENT DOCUMENTS

| | | | | |
|---|---|---|---|---|
| 4,322,253 A | * | 3/1982 | Pankove et al. | 438/528 |
| 4,532,537 A | * | 7/1985 | Kane | 257/458 |
| 5,738,732 A | * | 4/1998 | Nakamura et al. | 136/255 |
| 2002/0011264 A1 | * | 1/2002 | Saito | 136/258 |
| 2002/0173113 A1 | * | 11/2002 | Todd | 438/398 |
| 2006/0065297 A1 | * | 3/2006 | Terakawa | H01L 31/0747 136/255 |

(Continued)

OTHER PUBLICATIONS

Office Action dated Jul. 3, 2013 received in a related U.S. Patent Application, namely U.S. Appl. No. 13/603,932.

(Continued)

*Primary Examiner* — Sadie White
(74) *Attorney, Agent, or Firm* — Scully, Scott, Murphy & Presser, P.C.; Louis J. Percello, Esq.

(57) ABSTRACT

A photovoltaic device is provided in which the tunneling barrier for hole collection at either the front contact or the back contact of a silicon heterojunction cell is reduced, without compromising the surface passivation either the front contact or at the back contact. This is achieved in the present disclosure by replacing the intrinsic and/or doped hydrogenated amorphous silicon (a-Si:H) layer(s) at the back contact or at the front contact with an intrinsic and/or doped layer(s) of a semiconductor material having a lower valence band-offset than that of a:Si—H with c-Si, and/or a higher activated doping concentration compared to that of doped hydrogenated amorphous Si. The higher level of activated doping is due to the higher doping efficiency of the back contact or front contact semiconductor material compared to that of amorphous Si, and/or modulation doping of the back or front contact semiconducting material. As a result, the tunneling barrier for hole collection is reduced and the cell efficiency is improved accordingly.

12 Claims, 6 Drawing Sheets

(56) References Cited

U.S. PATENT DOCUMENTS

| | | | |
|---|---|---|---|
| 2006/0219292 A1* | 10/2006 | Asaumi | B82Y 20/00 |
| | | | 136/252 |
| 2006/0255340 A1* | 11/2006 | Manivannan et al. | 257/79 |
| 2007/0186970 A1 | 8/2007 | Takahashi et al. | |
| 2008/0000521 A1* | 1/2008 | Sivoththaman et al. | 136/254 |
| 2008/0023068 A1* | 1/2008 | Nakashima | H01L 31/0236 |
| | | | 136/256 |
| 2008/0223436 A1 | 9/2008 | Den Boer et al. | |
| 2009/0308453 A1* | 12/2009 | Cabarrocas et al. | 136/258 |
| 2010/0006145 A1* | 1/2010 | Lee | 136/255 |
| 2010/0038736 A1* | 2/2010 | Assefa et al. | 257/432 |
| 2010/0159676 A1* | 6/2010 | Lieten | C23C 16/0272 |
| | | | 438/487 |
| 2010/0326520 A1* | 12/2010 | Tsai | 136/258 |
| 2011/0240121 A1* | 10/2011 | Dalal | B82Y 20/00 |
| | | | 136/258 |
| 2011/0284074 A1* | 11/2011 | Liu et al. | 136/258 |
| 2012/0015474 A1* | 1/2012 | Wu | H01L 31/028 |
| | | | 438/96 |
| 2013/0081679 A1* | 4/2013 | Qu | H01L 31/0284 |
| | | | 136/255 |

OTHER PUBLICATIONS

Gruntz et al., "Photoelectron spectra of fluorinated amorphous silicon (a-Si:F)", Physical Review B, pp. 2069-2080, Aug. 15, 1981, vol. 24, No. 4.

Office Action dated Jan. 31, 2014 received in a related application, namely U.S. Appl. No. 13/603,932.

* cited by examiner

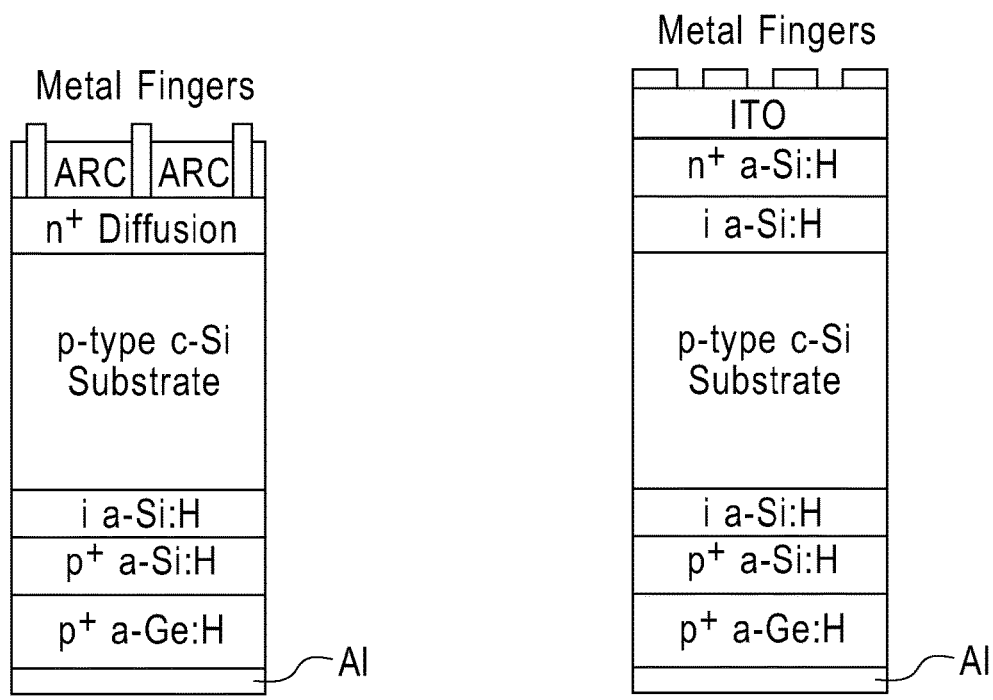
FIG. 7A
FIG. 7C
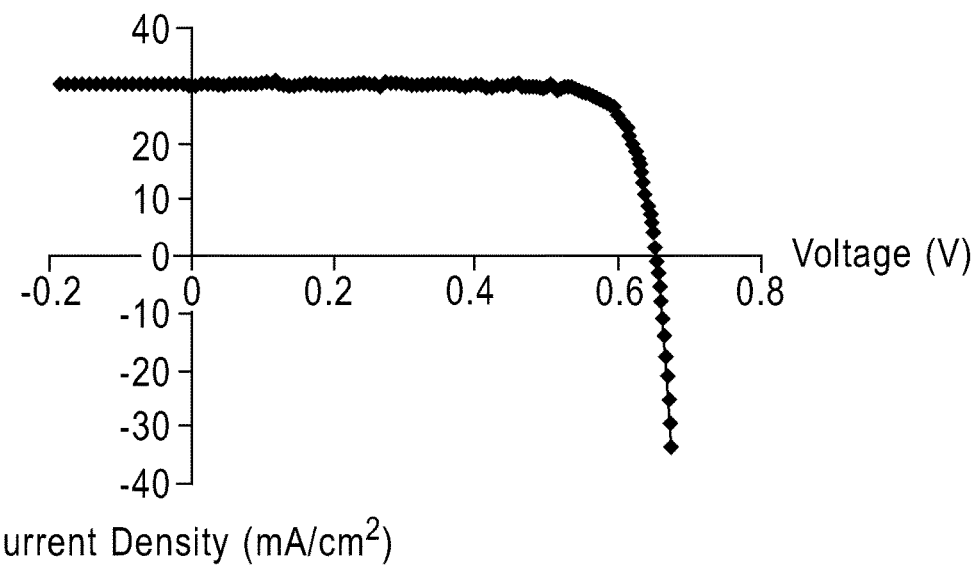
FIG. 7B

SILICON-CONTAINING HETEROJUNCTION PHOTOVOLTAIC ELEMENT AND DEVICE

BACKGROUND

The present disclosure relates to a photovoltaic device such as, for example, a solar cell, in which the tunneling barrier for hole collection at either the front contact or the back contact of a silicon-containing heterojunction cell is reduced, without compromising the surface passivation either at the front contact or at the back contact.

A photovoltaic device is a device that converts the energy of incident photons to electromotive force (e.m.f.). Typical photovoltaic devices include solar cells, which are configured to convert the energy in the electromagnetic radiation from the Sun to electric energy. Each photon has an energy given by the formula E=hv, in which the energy E is equal to the product of the Plank constant h and the frequency v of the electromagnetic radiation associated with the photon.

A photon having energy greater than the electron binding energy of a matter can interact with the matter and free an electron from the matter. While the probability of interaction of each photon with each atom is probabilistic, a structure can be built with a sufficient thickness to cause interaction of photons with the structure with high probability. When an electron is knocked off an atom by a photon, the energy of the photon is converted to electrostatic energy and kinetic energy of the electron, the atom, and/or the crystal lattice including the atom. The electron does not need to have sufficient energy to escape the ionized atom. In the case of a material having a band structure, the electron can merely make a transition to a different band in order to absorb the energy from the photon.

The positive charge of the ionized atom can remain localized on the ionized atom, or can be shared in the lattice including the atom. When the positive charge is shared by the entire lattice, thereby becoming a non-localized charge, this charge is described as a hole in a valence band of the lattice including the atom. Likewise, the electron can be non-localized and shared by all atoms in the lattice. This situation occurs in a semiconductor material, and is referred to as photogeneration of an electron-hole pair. The formation of electron-hole pairs and the efficiency of photogeneration depend on the band structure of the irradiated material and the energy of the photon. In case the irradiated material is a semiconductor material, photogeneration occurs when the energy of a photon exceeds the band gap energy, i.e., the energy difference of a band gap of the irradiated material.

The direction of travel of charged particles, i.e., the electrons and holes, in an irradiated material is sufficiently random (known as carrier "diffusion"). Thus, in the absence of an electric field, photogeneration of electron-hole pairs merely results in heating of the irradiated material. However, an electric field can break the spatial direction of the travel of the charged particles to harness the electrons and holes formed by photogeneration.

One exemplary method of providing an electric field is to form a p-n or p-i-n junction around the irradiated material. Due to the higher potential energy of electrons (corresponding to the lower potential energy of holes) in the p-doped material with respect to the n-doped material, an electric field is generated from the direction of the n-doped region toward the p-doped region. Electrons generated in the intrinsic and p-doped regions drift towards the n-doped region due to the electric field, and holes generated in the intrinsic and n-doped regions drift towards the p-doped region. Thus, the electron-hole pairs are collected systematically to provide positive charges at the p-doped region and negative charges at the n-doped region. The p-n or p-i-n junction forms the core of this type of photovoltaic device, which provides electromotive force that can power a device connected to the positive node at the p-doped region and the negative node at the n-doped region.

SUMMARY

A photovoltaic device such as, for example, a solar cell, is provided in which the tunneling barrier for hole collection at either the front contact or the back contact of a silicon-containing heterojunction cell is reduced. The reduction in the tunneling barrier for hole collection is obtained without compromising the surface passivation either at the front contact or at the back contact. In the present disclosure, the intrinsic and/or doped hydrogenated amorphous silicon (a-Si:H) layer(s) at the back contact or at the front contact is replaced with intrinsic and/or doped layer(s) of other semiconductor materials to reduce the tunneling barrier for hole collection and, in turn, enhance the efficiency of the photovoltaic device. This is achieved due to any or all of the following: (i) lower valence band offset between the absorption layer material and at least one of the contact layer materials, (ii) higher doping efficiency of at least one of the contact layer materials, and/or (iii) "transfer doping" (also known as "modulation doping") of at least one of the contact layer materials. The reduction of the tunneling barrier for hole collection and increased efficient is obtained without compromising the passivation of the either the front contact or the back contact.

In one embodiment of the present disclosure, a photovoltaic device is provided that includes an absorption layer comprising a silicon-containing semiconductor layer of a first conductivity type and having a top surface and a bottom surface that opposes the top surface. The photovoltaic device also includes a front contact located on the top surface of the absorption layer, and a back contact located on the bottom surface of the absorption layer. The back contact comprises at least one back contact semiconductor material layer of the first conductivity type and having a lower band-offset than that of hydrogenated amorphous silicon with crystalline Si, and/or a higher activated doping of the first conductivity type than that of the doped hydrogenated amorphous silicon layer. The higher activated doping in the aforementioned back contact materials may be due to a higher doping efficiency of the material compared to hydrogenated amorphous Si, and/or transfer doping of the back contact material. Transfer doping of the aforementioned back contact material refers to the transfer of the carriers corresponding to the first conductivity type from the adjacent semiconductor layer(s) into the aforementioned back contact material, and/or the transfer of the opposite type of carriers (corresponding to the second conductivity type) from the back-contact material into the adjacent semiconductor layer(s). Carriers corresponding to n-type conductivity are electrons, and carriers corresponding to p-type conductivity are holes. Throughout this disclosure, the second conductivity type refers to a conductivity type opposite to that of the first conductivity type, i.e. if the first conductivity type is p-type, the second conductivity type is n-type and vice versa.

In another embodiment of the present disclosure, a photovoltaic device is provided that includes an absorption layer comprising a silicon-containing semiconductor layer of a first conductivity type and having a top surface and a bottom surface that opposes the top surface. The photovoltaic device also includes a front contact located on the top surface of the absorption layer, and a back contact located on the bottom surface of the absorption layer. The front contact of this photovoltaic device comprises at least one front contact semiconductor material layer of a second conductivity type and having a lower band-offset than that of hydrogenated amorphous silicon with crystalline Si, and/or a higher activated doping of the second type than that of the doped hydrogenated amorphous silicon layer. The higher activated doping in the aforementioned back contact materials may be due to a higher doping efficiency of the material compared to hydrogenated amorphous Si, and/or transfer doping of the back contact material. Transfer doping of the aforementioned back contact material refers to the transfer of the carriers corresponding to the second conductivity type from the adjacent semiconductor layer(s) into the aforementioned back contact material, and/or the transfer of the opposite type of carriers (corresponding to the first conductivity type) from the back-contact material into the adjacent semiconductor layer(s).

The present disclosure also provides methods of forming the aforementioned photovoltaic devices. In one embodiment, the method includes providing an absorption layer comprising a silicon-containing semiconductor layer of a first conductivity type and having a top surface and a bottom surface that opposes the top surface. A front contact is formed on the top surface of the absorption layer, and a back contact is formed on the bottom surface of the absorption layer. The forming of the front contact and the back contact can occur in any order. The back contact that is formed comprises at least one back contact semiconductor material layer of the first conductivity type and having a lower band-offset than that of hydrogenated amorphous silicon with crystalline Si and/or a higher activated doping of the first conductivity type than that of the doped hydrogenated amorphous silicon layer.

In another embodiment of the present disclosure, the method includes providing an absorption layer comprising a silicon-containing semiconductor layer of a first conductivity type and having a top surface and a bottom surface that opposes the top surface. A front contact is formed on the top surface of the absorption layer, and a back contact is formed on the bottom surface of the absorption layer. The forming of the front and back contacts may occur in any order. The front contact that is formed in this embodiment comprises at least one front contact semiconductor material layer of a second conductivity type and having a lower band-offset than that of hydrogenated amorphous silicon with crystalline and/or a higher activated doping of the second conductivity type than that of the doped hydrogenated amorphous silicon layer. The second conductivity/doping type is opposite to that of the first conductivity/doping type.

BRIEF DESCRIPTION OF THE DRAWINGS

FIG. 7A is a pictorial representation (through a cross sectional view) illustrating a photovoltaic structure in accordance with Example 1 of the present disclosure.

FIG. 7B is a graph illustrating the experimental output characteristics of the photovoltaic device of FIG. 7A as measured under a light intensity of 1 sun.

FIG. 7C is a pictorial representation (through a cross sectional view) illustrating a photovoltaic structure in accordance with Example 1 of the present disclosure.

DETAILED DESCRIPTION

Figure 1:
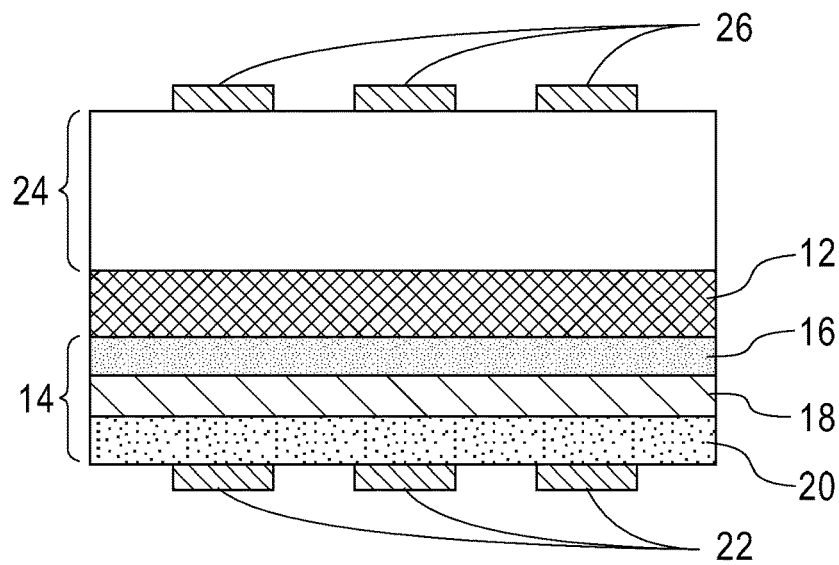
FIG. 1 is a pictorial representation (through a cross sectional view) depicting a photovoltaic device in accordance with one embodiment of the present disclosure.

The present disclosure, which provides photovoltaic devices with enhanced efficiency, will now be described in greater detail by referring to the following discussion and drawings that accompany the present application. It is noted that the drawings of the present application are provided for illustrative purposes only and, as such, the drawings are not drawn to scale. It is also noted that in the drawings like and corresponding elements are referred to using like reference numerals.

In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Prior art heterojunction intrinsic thin layer (HIT) solar cells have reached an efficiency up to 23% in laboratory and up to 21% efficiency in production. The prior art HIT cells are comprised of thin stacks of intrinsic/doped hydrogenated amorphous silicon (a-Si:H) serving as the front and back contacts, on an absorption layer composed of single-crystalline silicon (c-Si). The absorption layer of prior art HIT cells can have an n-type conductivity or p-type conductivity. However, HIT cells having absorption layers with p-type conductivities have lower efficiencies (up to 20%) than their counterparts including an absorption layer with n-type conductivities. This difference is efficiency is partly due to the large valence band-offset between a-Si:H and p-type c-Si which hampers the collection of holes at the back contact. A transparent conductive oxide (TCO) is typically used as the front contact electrode, while the back contact electrode is composed of TCO or a metal. Typically, metal fingers are used for improving the lateral collection of carriers when the contact electrode is composed of TCO.

One problem with the existing HIT solar cells is that the efficiency is hindered by high tunneling barriers for hole collection that exist at the back contact or the front contact of the HIT cell with c-Si absorption layers. This is due to the large valence band-offset between crystalline Si and hydrogenated amorphous Si, and/or the low doping efficiency of hydrogenated amorphous Si. Although it is possible to reduce the tunneling barrier for hole collection in either the front or back contact layers by reducing the thickness of the intrinsic and/or p+ a-Si:H layers within prior art HIT solar cells, such a method can compromise the passivation, and/or reduce the electric field at the back contact or the front contact of the HIT cell.

The present disclosure provides photovoltaic devices such as, for example, solar cells, in which the tunneling barrier for hole collection at either the front contact or the back contact of a silicon heterojunction cell is reduced, without compromising the surface passivation and/or the electric field either at the front contact or at the back contact.

The aforementioned is achieved in the present disclosure by replacing the intrinsic and/or doped hydrogenated amorphous silicon (a-Si:H) layer(s) at the back contact or at the front contact with an intrinsic and/or doped layer(s) of a semiconductor material having a lower valence band-offset than that of a:Si-H with c-Si, and/or a higher activated doping than that of doped hydrogenated amorphous silicon. This lowers the tunneling barrier for hole collection and enhances the efficiency of the photovoltaic device.

Band offset refers to the discontinuity of the energy bands at a heterojunction. In particular, conduction band offset between two materials is the difference between the electron affinities of the two materials, and valence band offset between two materials is the difference between the bandgap difference and the electron affinity difference of the two materials. The sum of the conduction band offset and valence band offset therefore equals the bandgap difference of the two the materials.

An activated impurity (i.e., dopant) atom refers to an impurity (i.e., dopant) atom which is accommodated in the host lattice in such a way (typically substitutionally, i.e., sitting on a lattice site, substituting a host atom) that it donates at least one free electron or accepts at least one free electron (donates at least one free hole) to the host lattice.

As known in the art, hydrogenated amorphous silicon typically deposited by PECVD or HWCVD (hot-wire CVD) may contain a nano/micro-crystalline, polycrystalline or single-crystalline portion. In particular, when grown directly on single-crystalline silicon, the initial portion or the entire film may be grown single-crystalline or poly-crystalline, depending on the growth conditions. Throughout this disclosure, the usage of the term "hydrogenated amorphous silicon" covers the possibility that the film may contain a crystalline portion.

As used herein, a "photovoltaic device" is a device, such as a solar cell, that produces free electrons hole pairs when exposed to radiation, such as light, and results in the production of an electric current. The photovoltaic device typically includes layers of p-type conductivity and n-type conductivity that share an interface to provide a junction. The "absorption layer" of the photovoltaic device is the material that readily absorbs photons to generate charge carriers, i.e., free electrons or holes. A portion of the photovoltaic device, between the front side and the junction is referred to as the emitter, and the junction is referred as the "emitter junction". The emitter represents a portion of the front contact. The emitter portion of the front contact may be present atop the absorption layer, in which the emitter includes at least one semiconductor layer that has a conductivity type that is opposite the conductivity type of the absorption layer. The back contact, which may be present below the absorption layer, has at least one semiconductor layer that has a conductivity type that is the same as the absorption layer.

In one example, when the Sun's energy in the form of photons collects in the cell layers electron-hole pairs are generated in the material within the photovoltaic device. The emitter junction provides the required electric field for the collection of the photogenerated electrons and holes on the p-doped side and n-doped sides of the emitter junction, respectively. For this reason, in this example, at least one p-type layer of the photovoltaic device may provide the absorption layer, and at least one adjacent n-type layer may provide the front contact. In another embodiment, at least one n-type layer of the photovoltaic device may provide the absorption layer, and at least one adjacent p-type layer may provide the emitter portion of the front contact.

Reference is first made to FIGS. 1, 2A, 2B, 2C, 3A, 3B, 3C, and 3D which illustrate an embodiment of the present disclosure in which the tunneling barrier for hole collection is reduced by replacing the intrinsic and/or doped hydrogenated amorphous silicon (a-Si:H) layer(s) at the back contact with an intrinsic and/or doped layer(s) of a semiconductor material having a lower valence band-offset than that of a:Si-H with c-Si and/or a higher activated doping than that of doped hydrogenated amorphous silicon.

Specifically, FIG. 1 depicts a photovoltaic device 10 in accordance with one embodiment of the present disclosure. The photovoltaic device 10 shown in FIG. 1 includes an absorption layer 12, a back contact 14, and a front contact 24. The photovoltaic device 10 also includes optional back metal fingers 22 present on a bottommost surface of the back contact 14, and optional front metal fingers 26 present on an upper most surface of the front contact 24. In the photovoltaic devices of the present disclosure, the front contact is located above the absorption layer, and the back contact is located beneath the absorption layer. Thus, photovoltaic devices of this disclosure comprise, from top to bottom, a front contact, an absorption layer and a back contact. In the present disclosure the order of forming the front and back contacts may vary and is not critical to the practice of the various embodiments of the present disclosure.

The absorption layer 12 employed in this embodiment of the present disclosure comprises a Si-containing semiconductor layer having a first conductivity type dopant present therein. In one embodiment, the first conductivity dopant is a p-type dopant, and therefore the absorption layer 12 comprises a p-type Si-containing semiconductor layer. In another embodiment, the first conductivity dopant is an n-type dopant, and therefore the absorption layer 12 comprises an n-type Si-containing semiconductor layer.

As used throughout the present application, "p-type" refers the addition of impurities to an intrinsic semiconductor that creates deficiencies of valence electrons. In a Si-containing absorption layer 12, examples of p-type dopants, i.e., impurities, include but are not limited to, boron, aluminum, gallium and indium. In one embodiment, in which the first conductivity type of the Si-containing semiconductor material of the absorption layer 12 is p-type, the p-type dopant is present in a concentration ranging from $1\times10^9$ atoms/cm$^3$ to $1\times10^{20}$ atoms/cm$^3$. In another embodiment, in which the first conductivity type is p-type, the p-type dopant is present in a concentration ranging from $1\times10^{14}$ atoms/cm$^3$ to $1\times10^{19}$ atoms/cm$^3$. As used throughout the present application, "n-type" refers to the addition of impurities that contributes free electrons to an intrinsic semiconductor. In a Si-containing absorption layer 12, examples of n-type dopants, i.e., impurities, include but are not limited to, antimony, arsenic and phosphorous. In one embodiment, in which the first conductivity type of the Si-containing semiconductor material of the absorption layer 12 is n-type, the n-type dopant is present in a concentration ranging from $1\times10^9$ atoms/cm$^3$ to $1\times10^{20}$ atoms/cm$^3$. In another embodiment, in which the first conductivity type is n-type, the n-type dopant is present in a concentration ranging from $1\times10^{14}$ atoms/cm$^3$ to $1\times10^{19}$.

In one embodiment, the absorption layer 12 can be a single crystalline Si-containing semiconductor material. The term "single crystalline" denotes a crystalline solid, in which the crystal lattice of the entire sample is substantially continuous and substantially unbroken to the edges of the sample, with substantially no grain boundaries. In another embodiment, the absorption layer 12 can be a multicrystalline semiconductor material. A multicrystalline semiconductor material typically includes large grains of crystalline semiconductor material.

In one embodiment, the absorption layer 12 is composed of at least one of Si, SiGe, SiC, and SiGeC. Typically, the Si-containing semiconductor material of the absorption layer 12 comprises single-crystalline Si. In one embodiment, the Si-containing semiconductor material of the absorption layer 12 comprises multicrystalline Si. In another embodiment, the absorption layer 12 is p-type single crystalline Si.

The absorption layer 12 typically has a thickness ranging from 5 nm to 5 microns, with a thickness from 50 nm to 2 microns being more typical. Other thicknesses which can be greater than or less than the thickness range mentioned hereinabove can also be employed. The band gap of the absorption layer 12 is typically from 0.6 eV to 1.2 eV, with a band gap from 0.8 eV to 1.1 eV being more typical.

The optional back metal fingers 22 and optional front metal fingers 26 shown in the drawings may be deposited using a screen printing technique. In another embodiment, the optional back metal fingers 22 and optional front metal fingers 26 are provided by the application of an etched or electroformed metal pattern. The metallic material used in forming the metal pattern for the optional back metal fingers 22 and optional front metal fingers 26 may include applying a metallic paste. The metallic paste may be any conductive paste, such as Al paste, Ag paste or AlAg paste. The metallic material used in forming the metal pattern for the optional back metal fingers 22 and optional front metal fingers 26 may also be deposited using sputtering, thermal or e-beam evaporation, or plating. The thickness of metal fingers 22 and 26 may vary depending on the type of process used in forming the same. Typically, the metal fingers 22 and 26 have a thickness from 100 nm to 15 µm, with a thickness from 1 µm to 10 µm being more typical.

The order of forming the front contact 24 and the back contact 14 in this embodiment of the present disclosure is not critical. For example, the front contact 24 can be formed first and then the back contact 14 can be formed. In another embodiment, the back contact 14 can be formed first and then the front contact 24 can be formed.

Figure 2A:
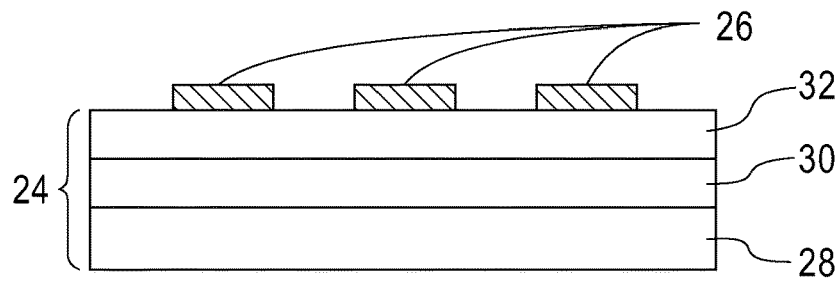
FIGS. 2A-2C are pictorial representations (through cross sectional views) depicting exemplary front contact structures that can be used in the photovoltaic device of FIG. 1.
Figure 2B:
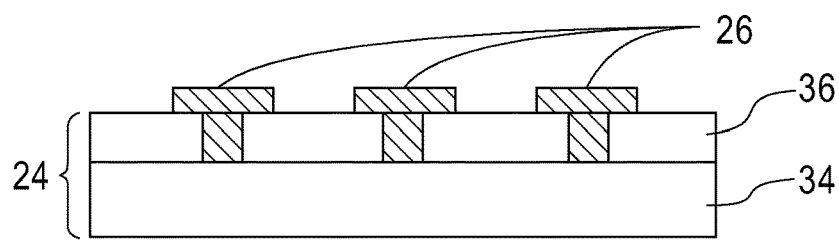
Figure 2C:
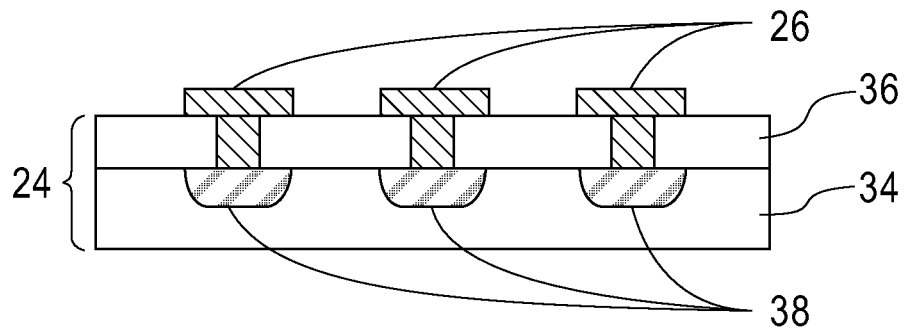

The photovoltaic device shown in FIG. 1 also includes a front contact 24 (i.e., emitter contact) which is located on a top surface of the absorption layer 12. In this embodiment of the present disclosure, the structure of the front contact 24 includes any conventional front contact structure that can be employed in photovoltaic devices. FIGS. 2A-2C illustrate some exemplary front contact structures that can be employed as the front contact 24 in the photovoltaic device 10 of FIG. 1. The top metal fingers 26 of FIG. 1 are duplicated in FIGS. 2A-2C.

Specifically, FIG. 2A illustrates a standard heterojunction contact structure that includes a front contact intrinsic amorphous semiconductor material layer 28 which is in direct contact with the top surface of the absorption layer 12. The term "intrinsic semiconductor", also called an undoped semiconductor or i-type semiconductor, is a substantially pure semiconductor without any significant dopant species present. The number of charge carriers in the intrinsic semiconductor is determined by the properties of the material itself instead of the amount of impurities, i.e., dopants. Typically, in intrinsic semiconductors the number of excited electrons and the number of holes are equal (n=p). The front contact intrinsic amorphous semiconductor material layer 28 can serve to passivate the top surface of the absorption layer 12, and reduce electron-hole recombination. The front contact intrinsic amorphous semiconductor material layer 28 is typically, but not necessarily always hydrogenated. Typically, the front contact intrinsic amorphous semiconductor material layer 28 is composed of intrinsic hydrogenated amorphous silicon (i a-Si:H). Typically, the thickness of the front contact intrinsic amorphous semiconductor material layer 28 is from 2 nm to 15 nm, although lesser and greater thicknesses can also be employed.

The front contact intrinsic amorphous semiconductor material layer 28 is formed utilizing any chemical or physical growth process including any semiconductor precursor source material. In some embodiments, the intrinsic hydrogenated semiconductor containing material used in forming layer 28 is deposited in a process chamber containing a semiconductor precursor source gas and a carrier gas including hydrogen. Hydrogen atoms in the precursor source gas or in the hydrogen gas within the carrier gas are incorporated into the deposited material to form the front contact intrinsic amorphous semiconductor material layer 28. The front contact intrinsic amorphous semiconductor material layer 28 is optional, and may be omitted.

The standard heterojunction contact structure shown in FIG. 2A also includes a front contact amorphous semiconductor layer 30 that has a second conductivity type that is different from the first conductivity type of the Si-containing semiconductor material employed as the absorption layer 12. Thus, when the absorption layer 12 comprises a p-type Si-containing semiconductor material, the front contact amorphous semiconductor layer 30 comprises n-type doping. In such an embodiment, the front contact amorphous semiconductor layer 30 has an n-type dopant concentration ranging from $10^{16}$ atoms/cm$^3$ to $10^{21}$ atoms/cm$^3$, with the range of $10^{18}$ atoms/cm$^3$ to $10^{20}$ atoms/cm$^3$ being more typical. The doping efficiency (i.e., the ratio of activated dopant atoms to the total dopant atoms) in layer 30 typically ranges from 0.1% to 20% although higher and lower doping efficiencies are possible. Typically, the doping efficiency is decreased by increasing the dopant atom concentration. Likewise, when the absorption layer 12 comprises an n-type Si-containing semiconductor material, the front contact amorphous semiconductor layer 30 comprises p-type doping. In such an embodiment, the front contact amorphous semiconductor layer 30 has a p-type dopant concentration ranging from $10^{16}$ atoms/cm$^3$ to $10^{21}$ atoms/cm$^3$, with the range of $10^{18}$ atoms/cm$^3$ to $10^{20}$ atoms/cm$^3$ being more typical. The doping efficiency (i.e., the ratio of activated dopant atoms to the total dopant atoms) in layer 30 typically ranges from 0.1% to 20% although higher and lower doping efficiencies are possible. Typically, the doping efficiency is decreased by increasing the dopant atom concentration.

In some embodiments, the front contact amorphous semiconductor layer 30 can be in direct contact with the top surface of the absorption layer 12. In another embodiment, the front contact intrinsic amorphous semiconductor material layer 28 is positioned between the front contact amorphous semiconductor layer 30 and the top surface of the absorption layer 12. The front contact amorphous semiconductor layer 30 can include one of the Si-containing semiconductor materials mentioned above for the absorption layer 12. In one embodiment, the front contact amorphous semiconductor layer 30 is comprised of the same Si-containing semiconductor material as that of the absorption layer 12. For example, the front contact amorphous semiconductor layer 30 and the absorption layer 12 can be both comprised of silicon.

The front contact amorphous semiconductor layer 30 can be formed utilizing any physical or chemical growth process that is well known to those skilled in the art. In one embodiment, the physical or chemical growth process includes an in-situ doped growth process in which the dopant atom is introduced with the semiconductor precursor source material, e.g., silane, during the formation of the front contact amorphous semiconductor layer 30.

In some embodiments, the front contact amorphous semiconductor layer 30 can be comprised of a hydrogenated amorphous semiconductor material. The hydrogenated amorphous semiconductor material that can be used as layer 30 can be deposited in a process chamber containing a semiconductor precursor source material gas and a carrier gas, which may contain hydrogen. To facilitate incorporation of hydrogen in the hydrogenated semiconductor-containing material, a carrier gas including hydrogen can be employed. Hydrogen atoms in the precursor gas and/or the carrier gas are incorporated into the deposited material to form a hydrogenated amorphous semiconductor-containing material that can be used as layer 30.

The thickness of the front contact amorphous semiconductor layer 30 can vary depending on the conditions of the growth process employed, as well as the duration of growth. Typically, the front contact amorphous semiconductor layer 30 has a thickness from 3 nm to 30 nm.

The standard heterojunction contact structure shown in FIG. 2A further includes a front contact transparent conductive material layer 32 that is located on an upper surface of the front contact amorphous semiconductor layer 30. Throughout this disclosure, an element is "transparent" if the element is sufficiently transparent in the visible electromagnetic spectral range. The front contact transparent conductive material layer 32 includes a conductive material that is transparent in the range of electromagnetic radiation at which photogeneration of electrons and holes occur within the solar cell structure. In one embodiment, the front contact transparent conductive material layer 32 can include a transparent conductive oxide such as, but not limited to, a fluorine-doped tin oxide ($SnO_2$:F), an aluminum-doped zinc oxide (ZnO:Al), tin oxide (SnO) and indium tin oxide ($InSnO_2$, or ITO for short). The thickness of the front contact transparent conductive material layer 32 may vary depending on the type of transparent conductive material employed, as well as the technique that was used in forming the transparent conductive material. Typically, and in one embodiment, the thickness of the front contact transparent conductive material layer 32 ranges from 20 nm to 500 nm. Other thicknesses, including those less than 20 nm and/or greater than 500 nm can also be employed. The optimum thickness of TCO for minimizing reflection from the surface of Si is in the range of 70 nm to 110 nm. The front contact transparent conductive material layer 32 is typically formed using a deposition process, such as sputtering or CVD. Examples of CVD processes suitable for forming the front contact transparent conductive material layer 32 include, but are not limited to, APCVD, LPCVD, PECVD, MOCVD and combinations thereof. Examples of sputtering include, but are not limited to, RF and DC magnetron sputtering.

The top, bottom, or both surfaces of the absorption layer 12, and/or the top surface of the transparent conductive material layer 32 may be textured. A textured (i.e., specially roughened) surface is used in solar cell applications to increase the efficiency of light absorption. The textured surface decreases the fraction of incident light lost to reflection relative to the fraction of incident light transmitted into the cell since photons incident on the side of an angled feature will be reflected onto the sides of adjacent angled features and thus have another chance to be absorbed. Moreover, the textured surface increases internal absorption, since light incident on an angled surface will typically be deflected to propagate through the device at an oblique angle, thereby increasing the length of the path taken to reach the device's back surface, as well as making it more likely that photons reflected from the device's back surface will impinge on the front surface at angles compatible with total internal reflection and light trapping. In one embodiment, the texturing is achieved utilizing a hydrogen based wet etch chemistry, such as, for example, etching in HCl. In some embodiments, the textured upper surface can be achieved during formation, i.e., deposition, of the front contact transparent conductive material layer 32. In one embodiment, the texturing of the single-crystalline Si absorbing layer 10 is achieved utilizing a KOH based wet etch chemistry to realize random pyramids, or inverted pyramids.

The optional front metal fingers 26 can be formed atop the front contact transparent conductive material layer 32 utilizing one of the techniques mentioned above.

FIG. 2B illustrates a standard single emitter structure that can be employed as the front contact 24. The standard single emitter includes a semiconductor material layer 34 of a second conductivity type that is opposite the first conductivity type of the Si-containing semiconductor material employed as the absorption layer 12. Thus, when the absorption layer 12 comprises a p-type Si-containing semiconductor material, the semiconductor material layer 34 comprises n-type doping. In such an embodiment the semiconductor material layer 34 has an n-type dopant concentration ranging from $10^{16}$ atoms/cm$^3$ to $5 \times 10^{20}$ atoms/cm$^3$, with the range of $10^{18}$ atoms/cm$^3$ to $5 \times 10^{19}$ atoms/cm$^3$ being more typical. Likewise, when the absorption layer 12 comprises an n-type Si-containing semiconductor material, the semiconductor material layer 34 comprises p-type doping. In such an embodiment the semiconductor material layer 34 has a p-type dopant concentration ranging from $10^{16}$ atoms/cm$^3$ to $5 \times 10^{20}$ atoms/cm$^3$, with the range of $10^{18}$ atoms/cm$^3$ to $5 \times 10^{19}$ atoms/cm$^3$ being more typical.

The semiconductor material layer 34, which is in direct contact with the top surface of the absorption layer 12, can comprise the same or different semiconductor material as that of the absorption layer 12. In one embodiment, the semiconductor material layer 34 and the absorption layer 12 are both comprised of Si. The semiconductor material layer 34 can be single crystalline or a microcrystalline semiconductor material.

The standard single emitter structure shown in FIG. 2B also includes a patterned dielectric material 36 located on an upper surface of the semiconductor material layer 34. The patterned dielectric material 36 can include any insulator material including, for example, an oxide, a nitride and/or an oxynitride. In one embodiment, the patterned dielectric material 36 is comprised of a semiconductor oxide, a semiconductor nitride and/or a semiconductor oxynitride. In some embodiments, the patterned dielectric material 36 can have anti-reflective properties. In such an instance, the patterned dielectric material 36 can comprise a dual layer structure composed of zinc-sulfide (ZnS) and magnesium fluoride ($MgF_2$), on top of the oxide, nitride or oxynitride layer.

The patterned dielectric material 36 can be formed by first depositing a blanket layer of dielectric material on the upper surface of the semiconductor material layer 34 utilizing any deposition process including, for example, chemical vapor deposition, plasma enhanced chemical vapor deposition, atomic layer deposition and chemical solution deposition. The blanket layer of dielectric material may be also grown by a chemical reaction consuming part of the semiconductor layer 34, such as dry or wet oxidation. Following deposition of the blanket dielectric material layer, the dielectric material layer can be patterned by lithography and etching. Lithography includes applying a photoresist to the upper surface of the material layer to be patterned, exposing the photoresist to a desired pattern of radiation and developing the resist pattern utilizing a conventional developer. The etching that can be used to pattern the blanket dielectric material layer can include dry etching (i.e., reactive ion etching, plasma etching, ion beam etching or laser ablation) or wet etching.

The metal fingers 26 are then formed as described above into the openings within the patterned dielectric material 36 as shown in FIG. 2B. In this embodiment, a lower portion of the metal fingers within the opening contacts an upper surface of the semiconductor material layer 34.

FIG. 2C illustrates a standard double emitter contact structure that can be used as front contact 24. The double emitter contact structure shown in FIG. 2C is similar to the single emitter structure shown in FIG. 2B except that highly doped regions 38 are present at the contact areas with the fingers. Highly doped regions 38 may be formed in the semiconductor material layer 34 utilizing the patterned dielectric material 36 as an ion implantation mask followed by a diffusion drive-in. The highly doped regions 38 include the same conductivity type dopant as the semiconductor material layer 34. However, the concentration of the dopant within the highly doped regions 38 is greater than the dopant that is present in the semiconductor material layer 34. When the highly doped regions 38 and the semiconductor material layer 34 both include an n-type dopant, the n-type dopant concentration in the highly doped regions 38 can range from $10^{18}$ atoms/cm$^3$ to $5 \times 10^{20}$ atoms/cm$^3$. Likewise, when the highly doped regions 38 and the semiconductor material layer 34 both include a p-type dopant, the p-type dopant concentration in the highly doped regions 38 can range from $10^{18}$ atoms/cm$^3$ to $5 \times 10^{20}$ atoms/cm$^3$.

The contact structure shown in FIG. 2C is formed utilizing the same basic processing steps mentioned above for forming the single emitter structure shown in FIG. 2B except that prior to forming metal fingers 26, a second conductivity type dopant is introduced into the semiconductor material layer 34 for example by ion implantation or gas phase diffusion utilizing the patterned dielectric material 36 as an ion implantation mask. In the case of ion implantation, a diffusion anneal is performed subsequently, utilizing standard diffusion anneal temperatures that are well known to those skilled in the art.

Referring back to FIG. 1, the back contact 14 of the illustrated photovoltaic device includes an optional back contact intrinsic amorphous semiconductor material layer 16 which is in direct contact with the bottom surface of the absorption layer 12. Again the term "intrinsic semiconductor" denotes a substantially pure semiconductor without any significant dopant species present. The number of charge carriers in the intrinsic semiconductor is determined by the properties of the material itself instead of the amount of impurities, i.e., dopants. Typically, in intrinsic semiconductors the number of excited electrons and the number of holes are equal (n=p). The back contact intrinsic amorphous semiconductor material layer 16 can serve to passivate the bottom surface of the absorption layer 12, and reduce electron-hole recombination. The back contact intrinsic amorphous semiconductor material layer 16 is typically, but not necessarily always hydrogenated. Typically, the back contact intrinsic amorphous semiconductor material layer 16 is composed of intrinsic hydrogenated amorphous silicon (i a-Si:H), hydrogenated amorphous Ge (a-Ge:H), or hydrogenated amorphous silicon germanium alloy (a-SiGe:H).

In some cases, the back contact intrinsic amorphous semiconductor material layer 16 comprises a same semiconductor material as the absorption layer 12. In other embodiments, the back contact intrinsic amorphous semiconductor material layer 16 has a lower valence band-offset than that of the absorption layer 12.

In cases in which the intrinsic layer includes SiGe, the Si (or Ge) content of the SiGe alloy may vary in a gradient fashion which can either increase or decrease from a surface of layer 16 that is nearest to the absorption layer 12 to a surface of layer 16 that is furthest from the absorption layer 12. The back contact intrinsic amorphous semiconductor material layer 16 can also include carbon, fluorine, deuterium, oxygen and/or nitrogen, which can be added either during or after formation of the back contact intrinsic amorphous semiconductor material layer 16.

Typically, the thickness of the back contact intrinsic amorphous semiconductor material layer 16 is from 2 nm to 25 nm, although lesser and greater thicknesses can also be employed.

The back contact intrinsic amorphous semiconductor material layer 16 is formed utilizing any chemical or physical growth process including any semiconductor precursor source material. In some embodiments, the intrinsic hydrogenated semiconductor containing material used in forming layer 16 is deposited in a process chamber containing a semiconductor precursor source gas and a carrier gas which may include hydrogen. Hydrogen atoms in the precursor gas or in the hydrogen gas within the carrier gas are incorporated into the deposited material to form the back contact intrinsic amorphous semiconductor material layer 16. The back contact intrinsic amorphous semiconductor material layer 16 is optional, and may be omitted.

The back contact 14 shown in FIG. 1 also includes a back contact semiconductor material layer 18 of the first conductivity type located either directly on the bottom surface of the absorption layer 12 or on a bottom surface of the back contact intrinsic amorphous semiconductor material layer 16. The back contact semiconductor material layer 18 employed in this embodiment of the present disclosure has a lower valence band-offset than that of hydrogenated amorphous silicon with crystalline silicon, and/or a higher activated doping than that of doped hydrogenated amorphous silicon.

In one embodiment, and when the absorption layer comprises Si, the back contact semiconductor material layer 18 can be comprised of Ge or a SiGe alloy. When a SiGe alloy is employed as the back contact semiconductor material layer 18, the Si (or Ge) content may be constant throughout the entire thickness of the back contact semiconductor material layer 18. In other embodiments, the Si (or Ge) content of the SiGe alloy may vary in a gradient fashion which can for example increase or decrease from a surface of the back contact semiconductor material layer 18 that is nearest to the absorption layer 12 to a surface of the back contact semiconductor material layer 18 that is furthest from the absorption layer 12.

The back contact semiconductor material layer 18 can be amorphous, nanocrystalline (i.e., microcrystalline) or polycrystalline. In some embodiments, back contact semiconductor material layer 18 can be hydrogenated. In other embodiments, the back contact semiconductor material layer 18 is not hydrogenated.

As inferred to above, the back contact semiconductor material layer 18 and the absorption layer 12 are of the same conductivity type. However, the first conductivity type dopant present in the back contact semiconductor material layer 18 is greater than the first conductivity type dopant present in the absorption layer 12. When the absorption layer 12 includes an n-type dopant, the n-type dopant concentration in the back contact semiconductor material layer 18 can range from $10^{16}$ atoms/cm$^3$ to $10^{21}$ atoms/cm$^3$, with the range of $10^{18}$ atoms/cm$^3$ to $10^{20}$ atoms/cm$^3$ being more typical. The doping efficiency (i.e., the ratio of activated dopant atoms to the total dopant atoms) in layer 18 typically ranges from 0.1% to 20% although higher and lower doping efficiencies are possible. Typically, the doping efficiency is decreased by increasing the dopant atom concentration. Likewise, when the absorption layer 12 includes a p-type dopant, the p-type dopant concentration in the back contact semiconductor material layer 18 can range from $10^{16}$ atoms/cm$^3$ to $10^{21}$ atoms/cm$^3$, with the range of $10^{18}$ atoms/cm$^3$ to $10^{20}$ atoms/cm$^3$ being more typical. The doping efficiency (i.e., the ratio of activated dopant atoms to the total dopant atoms) in layer 18 typically ranges from 0.1% to 20% although higher and lower doping efficiencies are possible. Typically, the doping efficiency is decreased by increasing the dopant atom concentration. The back contact semiconductor material layer 18 can also include carbon, fluorine, deuterium, oxygen and/or nitrogen, which can be added either during or after formation of the back contact semiconductor layer 18.

The back contact semiconductor material layer 18 can be formed utilizing any physical or chemical growth process that is well known to those skilled in the art. In one embodiment, the growth process includes an in-situ doped epitaxial growth process in which the dopant atom is introduced with the semiconductor precursor source material, e.g., a silane, during the formation of the back contact semiconductor material layer 18. In another embodiment, a growth process is used to form an undoped semiconductor layer, and thereafter the dopant can be introduced using one of ion implantation, gas phase doping, liquid solution spray/mist doping, and/or out-diffusion of a dopant atom from an overlying sacrificial dopant material layer that can be formed on the undoped semiconductor material, and removed after the out-diffusion process.

In some embodiments, the back contact semiconductor material layer 18 can be comprised of a hydrogenated semiconductor material. The hydrogenated semiconductor material that can be used as layer 18 can be deposited in a process chamber containing a semiconductor precursor source material gas and a carrier gas which may contain hydrogen. Hydrogen atoms in the precursor and/or carrier gas are incorporated into the deposited material to form a hydrogenated semiconductor-containing material that can be used as layer 18.

The back contact 14 shown in FIG. 1 also includes a back contact transparent conductive material layer 20 that is located beneath the back contact semiconductor material layer 18. The back contact transparent conductive material layer 20 can include one of the conductive materials, have a textured surface and have a thickness as mentioned above for the front contact transparent conductive material layer 32 shown in FIG. 2A. The back contact transparent conductive material layer 20 can be made using one of the techniques mentioned above in forming the front contact transparent conductive material layer 32. Alternatively, a metal layer may be used instead of the transparent conductive material, layer 20. Typically, if layer 20 is a transparent conductive material, metal fingers 22 are required, while if layer 20 is a metal, metal fingers 22 are not used. The usage of a transparent conductive material facilitates the bifacial operation of the solar cell, if desired.

The optional back contact metal fingers 22 can be formed beneath back contact transparent conductive material layer 20 utilizing one of the techniques mentioned above.

Figure 3A:
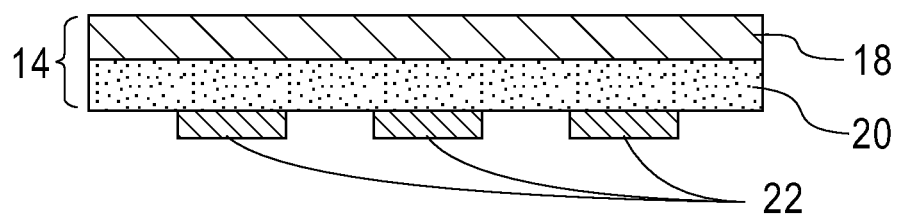
FIGS. 3A-3D are pictorial representations (through cross sectional views) depicting other back contact structures of the present disclosure that can be used in place of the back contact structure illustrated in FIG. 1.

Reference is now made to FIGS. 3A-3D which depict other back contact structures of the present disclosure that can be used in place of the back contact structure illustrated in FIG. 1. FIG. 3A shows an embodiment in which no back contact intrinsic amorphous semiconductor material layer 16 is present.

Figure 3B:
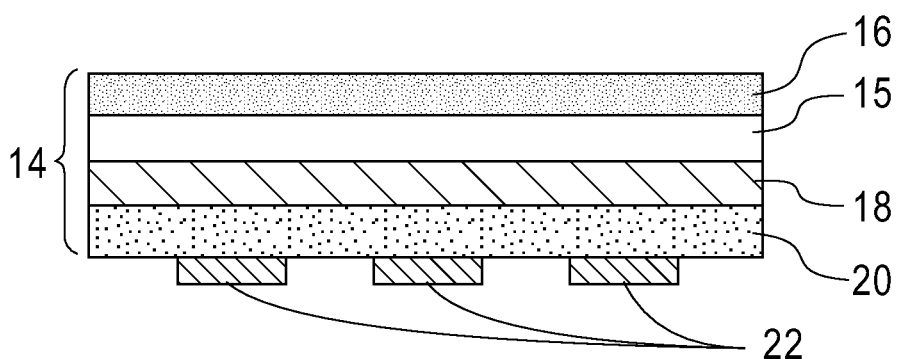

FIG. 3B illustrates an embodiment in which a back contact hydrogenated amorphous semiconductor material layer 15 of the first conductivity type is positioned between layers 16 and 18. Thus, when the absorption layer 12 comprises a p-type semiconductor material, the back contact hydrogenated amorphous semiconductor material layer 15 comprises p-type doping. In such an embodiment, the back contact hydrogenated amorphous semiconductor material layer 15 has a p-type dopant concentration ranging from $10^{16}$ atoms/cm$^3$ to ato $10^{21}$ atoms/cm$^3$, with the range of $10^{18}$ atoms/cm$^3$ to $10^{20}$ atoms/cm$^3$ being more typical. The doping efficiency (i.e., the ratio of activated dopant atoms to the total dopant atoms) in layer 15 typically ranges from 0.1% to 20% although higher and lower doping efficiencies are possible. Typically, the doping efficiency is decreased by increasing the dopant atom concentration. Likewise, when the absorption layer 12 comprises an n-type semiconductor material, the back contact hydrogenated amorphous semiconductor material layer 15 comprises n-type doping. In such an embodiment, the back contact hydrogenated amorphous semiconductor material layer 15 has an n-type dopant concentration ranging from $10^{16}$ atoms/cm$^3$ to $10^{21}$ atoms/cm$^3$, with the range of $10^{18}$ atoms/cm$^3$ to $10^{20}$ atoms/cm$^3$ being more typical. The doping efficiency (i.e., the ratio of activated dopant atoms to the total dopant atoms) in layer 15 typically ranges from 0.1% to 20% although higher and lower doping efficiencies are possible. Typically, the doping efficiency is decreased by increasing the dopant atom concentration.

The back contact hydrogenated amorphous semiconductor material layer 15 may or may not comprise the same semiconductor material as that of the absorption layer 12. In one embodiment, when the absorption layer 12 comprises Si, the back contact hydrogenated amorphous semiconductor material layer 15 comprises hydrogenated amorphous Si, and may contain carbon and/or germanium. The concentration of carbon and/or germanium may be constant or vary across the layer.

The back contact hydrogenated amorphous semiconductor material layer 15 can be deposited in a process chamber containing a semiconductor precursor source material gas, first conductivity type dopant and a carrier gas, which may contain hydrogen. Hydrogen atoms in the precursor and/or carrier gas are incorporated into the deposited material.

The thickness of the back contact hydrogenated amorphous semiconductor material layer 15 may vary. Typically, the back contact hydrogenated amorphous semiconductor material layer 15 has a thickness from 3 nm to 30 nm.

Figure 3C:
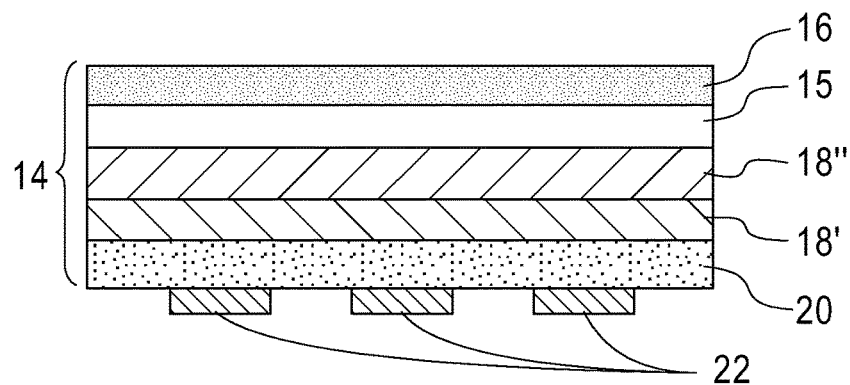
Figure 3D:
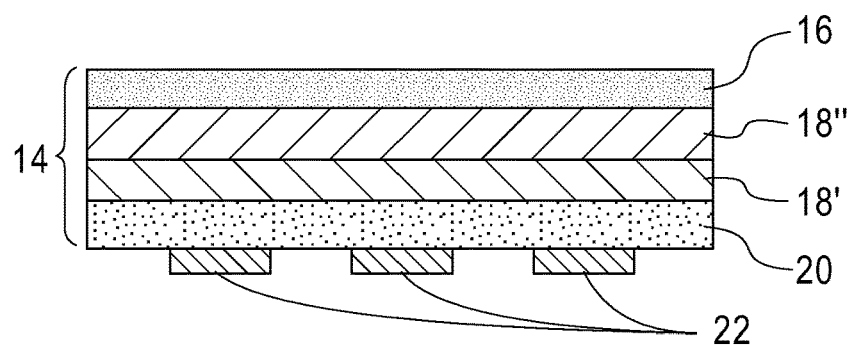

FIGS. 3C and 3D show an embodiment in which back contact semiconductor material layer includes a first back contact semiconductor material layer 18' and a second back contact semiconductor material layer 18". In these embodiments, the first and second back contact semiconductor material layer 18', 18" are comprised of different semiconductor materials that both have the lower valence band-offset than that of hydrogenated amorphous silicon with crystalline silicon, and/or higher activated doping levels than that of doped hydrogenated amorphous silicon. In one embodiment, the first back contact semiconductor material layer 18' is comprised of hydrogenated amorphous Ge and the second back contact semiconductor material layer 18" is comprised of hydrogenated amorphous SiGe.

It is noted that in each of FIGS. 1, 3A, 3B, 3C and 3D, the lower band-offset semiconductor material within the back contact structure improves the collection of holes at the back contact by reducing the tunneling barrier for holes.

Reference is now made to FIGS. 4, 5A, 5B, 5C, 5D, 6A, 6B, 6D, 6E which illustrate an embodiment of the present disclosure in which the tunneling barrier for hole collection is reduced by replacing the intrinsic and/or doped hydrogenated amorphous silicon (a-Si:H) layer(s) at the front contact with an intrinsic and/or doped layer(s) of a semiconductor material having a lower valence band-offset than that of a:Si-H with c-Si as the absorption layer, and/or higher activated doping level(s) than that of doped hydrogenated amorphous silicon.

Figure 4:
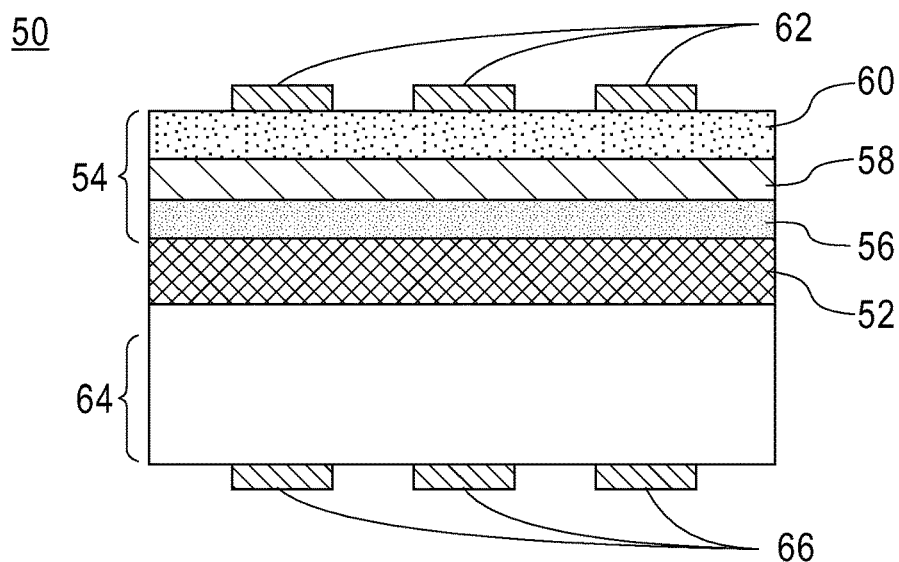
FIG. 4 is a pictorial representation (through a cross section view) depicting a photovoltaic device in accordance with another embodiment of the present disclosure.

Specifically, FIG. 4 depicts a photovoltaic device 50 in accordance with another embodiment of the present disclosure. The photovoltaic device 50 shown in FIG. 4 includes an absorption layer 52, a back contact 64, and a front contact 54. The photovoltaic device also includes optional back metal fingers 66 present on a bottommost surface of the back contact 64, and optional front metal fingers 62 present on an upper most surface of the front contact 54. It is again noted that the order of forming the back contact and the front contact may vary.

In this embodiment, the absorption layer 52 is the same as that mentioned above for absorption layer 12. As such, the semiconductor material, doping concentration, thickness and methods of forming absorption layer 12 are applicable here for forming absorption layer 52. In one embodiment, absorption layer 52 is n-type crystalline Si.

Also, in this embodiment, the optional front metal fingers 62 and the optional back metal fingers 66 employed are the same as that mentioned above for optional front metal fingers 22 and the optional back metal fingers 26. As such, the materials and processes mentioned above for forming the optional front and back metal fingers 22, 26 can be used here in this embodiment for forming optional front and back metal fingers 62, 66.

The back contact 64 of the photovoltaic device 50 illustrated in FIG. 4 may include any conventional back contact structure that is well known to those skilled in the art. FIGS. 5A, 5B, 5C and 5D are some exemplary back contact structures that can be used as back contact 64 shown in the FIG. 4. The back fingers 66 are duplicated in the back contact structures shown in FIGS. 5A-5D.

Figure 5A:
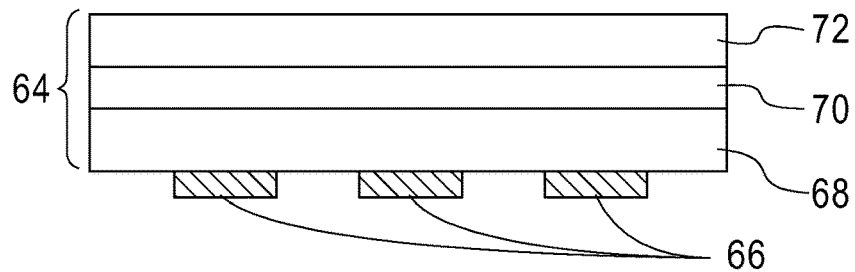
FIG. 5A-5D are pictorial representations (through cross sectional views) depicting exemplary back contact structures that can be used in the photovoltaic device of FIG. 4.

Specifically, FIG. 5A illustrates a standard back contact heterostructure which includes an optional back contact intrinsic amorphous semiconductor material layer 72 located on a bottom surface of the adsorption layer 52. In this embodiment, the back contact intrinsic amorphous semiconductor material layer 72 comprises the same material as that of the absorption layer 52. The optional back contact intrinsic amorphous semiconductor material layer 72 can serve to passivate the bottom surface of the absorption layer 52, and reduce electron-hole recombination. The optional back contact intrinsic amorphous semiconductor material layer 72 is typically, but not necessarily always hydrogenated. Typically, the thickness of the optional back contact intrinsic amorphous semiconductor material layer 72 is from 3 nm to 30 nm, although lesser and greater thicknesses can also be employed.

The optional back contact intrinsic amorphous semiconductor material layer 72 can be formed utilizing any physical or chemical growth process including any semiconductor precursor source material. In some embodiments, the intrinsic hydrogenated semiconductor containing material used in forming layer 72 is deposited in a process chamber containing a semiconductor precursor source gas and a carrier gas which may include hydrogen. Hydrogen atoms in the precursor and/or carrier gas are incorporated into the deposited material to form the optional back contact intrinsic amorphous semiconductor material layer 72.

The back contact structure shown in FIG. 5A also includes a back contact amorphous semiconductor layer 70 that has a first conductivity type that is same as the first conductivity type of the Si-containing semiconductor material employed as the absorption layer 52. Thus, when the absorption layer 52 comprises a p-type Si-containing semiconductor material, the back contact amorphous semiconductor layer 70 comprises p-type doping. In such an embodiment, the back contact amorphous semiconductor layer 70 has a p-type dopant concentration ranging from $10^{16}$ atoms/cm$^3$ to $10^{21}$ atoms/cm$^3$, with the range of $10^{18}$ atoms/cm$^3$ to $10^{20}$ atoms/cm$^3$ being more typical. The doping efficiency (i.e., the ratio of activated dopant atoms to the total dopant atoms) in layer 70 typically ranges from 0.1% to 20% although higher and lower doping efficiencies are possible. Typically, the doping efficiency is decreased by increasing the dopant atom concentration. Likewise, when the absorption layer 52 comprises an n-type Si-containing semiconductor material, the back contact amorphous semiconductor layer 70 comprises n-type doping. In such an embodiment the back contact amorphous semiconductor layer 70 has an n-type dopant concentration ranging from $10^{16}$ atoms/cm$^3$ to $10^{21}$ atoms/cm$^3$, with the range of $10^{18}$ atoms/cm$^3$ to $10^{20}$ atoms/cm$^3$ being more typical. The doping efficiency (i.e., the ratio of activated dopant atoms to the total dopant atoms) in layer 70 typically ranges from 0.1% to 20% although higher and lower doping efficiencies are possible. Typically, the doping efficiency is decreased by increasing the dopant atom concentration.

The back contact amorphous semiconductor layer 70 can include one of the semiconductor materials mentioned above for the absorption layer 52. In one embodiment, the back contact amorphous semiconductor layer 70 is comprised of the same semiconductor material as that of the absorption layer 52. For example, the back contact amorphous semiconductor layer 70 and the absorption layer 52 can both be comprised of Si.

The back contact amorphous semiconductor layer 70 can be formed utilizing any physical or chemical growth process that is well known to those skilled in the art. In one embodiment, the growth process includes an in-situ doped epitaxial growth process in which the dopant atom is introduced with the semiconductor precursor source material, e.g., a silane, during the formation of the back contact amorphous semiconductor layer 70.

In some embodiments, the back contact amorphous semiconductor layer 70 can be comprised of a hydrogenated amorphous semiconductor material. The hydrogenated amorphous semiconductor material that can be used as layer 70 can be deposited in a process chamber containing a semiconductor precursor source material gas and a carrier gas, which may contain hydrogen. Hydrogen atoms in the precursor and/or carrier gas are incorporated into the deposited material to form a hydrogenated amorphous semiconductor-containing material that can be used as layer 70.

The thickness of the back contact amorphous semiconductor layer 70 can vary depending on the conditions and duration of the growth process employed. Typically, the back contact amorphous semiconductor layer 70 has a thickness from 3 nm to 30 nm.

The back contact structure shown in FIG. 5A also includes a back contact transparent conductive material layer 68 located beneath layer 70. The back contact transparent conductive material layer 68 of this embodiment can include one of the conductive materials mentioned above for the front contact transparent conductive material layer 32. The back contact transparent conductive material layer 68 of this embodiment can also be formed utilizing one of the techniques mentioned above for the front contact transparent conductive material layer 32, and the thickness of the back contact transparent conductive material layer 68 can be within the range provided above for the front contact transparent conductive material layer 32.

Figure 5B:
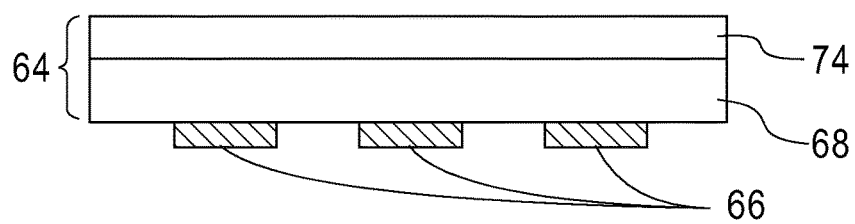

FIG. 5B illustrates another back contact structure that can be employed with the photovoltaic device 50 shown in FIG. 4. The back contact structure shown in FIG. 5B, which represents a blanket back surface field region, includes a back contact semiconductor material layer 74 having the first conductivity type located beneath and in contact with a bottom surface of absorption layer 52. The back contact semiconductor material layer 74 having the first conductivity type typically includes the same semiconductor material as that of the absorption layer 52. Thus, and in one embodiment, the back contact semiconductor material layer 74 having the first conductivity type and the absorption layer 52 are both comprised of single crystalline or multicrystalline Si.

As mentioned above, the back contact semiconductor material layer 74 and the absorption layer 52 are both of the first conductivity type. Thus, when the absorptive layer 52 comprises a p-type dopant, the back contact semiconductor material layer 74 comprises p-type doping. In such an embodiment, the back contact semiconductor material layer 74 has a p-type dopant concentration ranging from $10^{16}$ atoms/cm$^3$ to $5\times10^{20}$ atoms/cm$^3$. Likewise, when the absorption layer 52 comprises an n-type semiconductor material, the back contact semiconductor material layer 74 comprises n-type doping. In such an embodiment, the back contact semiconductor material layer 74 has an n-type dopant concentration ranging from $10^{16}$ atoms/cm$^3$ to $5\times10^{20}$ atoms/cm$^3$.

The back contact semiconductor material layer 74 can be formed utilizing any process well known to those skilled in the art. In one embodiment, the process includes an in-situ doped epitaxial growth process in which the dopant atom is introduced with the semiconductor precursor source material, e.g., a silane, during the formation of the back contact semiconductor material layer 74. In another embodiment, the dopant can be introduced into the absorption layer 52 to form the back contact layer 74 using one of ion implantation, gas phase doping, liquid solution spray/mist doping, and/or out-diffusion of a dopant atom from an overlying sacrificial dopant material layer that can be formed on the undoped semiconductor material, and removed after the out-diffusion process.

The thickness of the back contact semiconductor material layer 74 may vary depending on the exact conditions used in forming the layer. Typically, the back contact semiconductor material layer 74 has a thickness from 1 nm to 1 mm, with a thickness from 2 nm to 5 µm being more typical.

The back contact structure of FIG. 5B also includes a back contact transparent conductive material layer 68 located beneath layer 74. The back contact transparent conductive material layer 68 of this embodiment can include one of the conductive materials mentioned above for the front contact transparent conductive material layer 32. The back contact transparent conductive material layer 68 of this embodiment can also be formed utilizing one of the techniques mentioned above for the front contact transparent conductive material layer 32, and the thickness of the back contact transparent conductive material layer 68 can be within the range provided above for the front contact transparent conductive material layer 32. Similarly, a metal layer may be used instead of the transparent conductive material layer 68. Typically, if layer 68 is a transparent conductive material, metal fingers 66 are required, while if layer 68 is a metal, metal fingers 66 are not used. The usage of a transparent conductive material facilitates the bifacial operation of the solar cell, if desired.

Figure 5C:
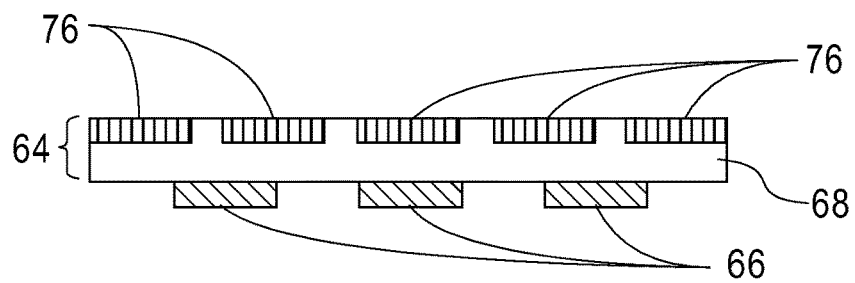

Reference is now made to FIG. 5C which shows a localized back contact structure that can be employed as the back contact 64 in the photovoltaic device 50 shown in FIG. 4 Specifically, the back contact structure shown in FIG. 5C includes a patterned dielectric material 76 that is located beneath portions of the absorption layer 52. The patterned dielectric material 76 includes one of the dielectric materials mentioned for patterned dielectric material 36. The patterned dielectric material 76 can be processed using the technique mentioned above in forming patterned dielectric material 36. The back contact structure further includes back contact transparent conductive material layer 68 that is located beneath the patterned dielectric material 76 and in gaps present between the patterned dielectric material 76. As shown, portions of the back contact transparent conductive material layer 68 within the gaps between the patterned dielectric material 76 are in direct contact with absorption layer 52.

Figure 5D:
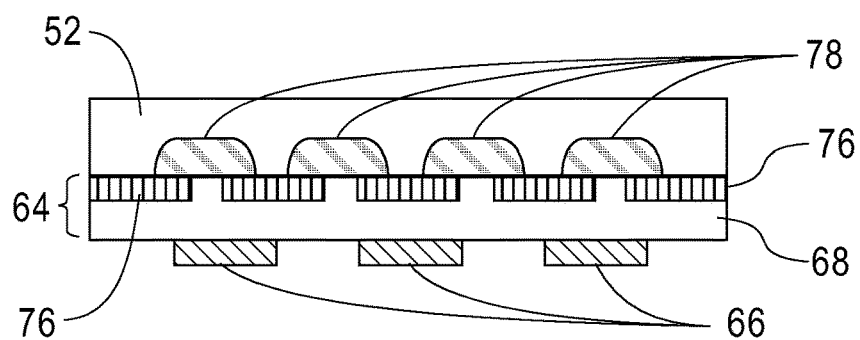

FIG. 5D illustrates another back contact structure that can be employed as the back contact 64 shown in the photovoltaic device 50 of FIG. 4. FIG. 5D, which can be referred to as a localized back surface field back region is similar to back contact structure shown in FIG. 5C except that highly doped regions 78 are formed at the contact areas with the fingers. Highly doped regions 78 may be formed into the absorption layer 52 (note the absorption layer 52 shown in FIG. 5D does not represent another absorption layer of the structure) by diffusion prior to forming the back contact transparent conductive material layer 68. The highly doped regions 78 have the same conductivity (i.e., first conductivity) as the absorption layer 52. However, the highly doped regions 78 have a high concentration of first conductivity type dopant than the absorption layer. When the highly doped regions 78 and the absorption layer 52 both include an n-type dopant, the n-type dopant concentration in the highly doped regions 78 can range from $10^{18}$ atoms/cm$^3$ to $5\times10^{20}$ atoms/cm$^3$. Likewise, when the highly doped regions 78 and the absorption layer 52 both include a p-type dopant, the p-type dopant concentration in the highly doped regions 78 can range from $10^{18}$ atoms/cm$^3$ to $5\times10^{20}$ atoms/cm$^3$.

Referring back to FIG. 4, the photovoltaic device 50 also includes a front contact 54. In the front contact 54 of this embodiment of the present disclosure the intrinsic and/or doped hydrogenated amorphous silicon (a-Si:H) layer(s) are replaced with an intrinsic and/or doped layer(s) of a semiconductor material having a lower valence band-offset than that of a:Si-H with c-Si, and/or higher activated doping level(s) than that of doped hydrogenated amorphous silicon.

The front contact 54 shown in FIG. 4 includes an optional front contact intrinsic amorphous semiconductor material layer 56 which is in direct contact with the top surface of the absorption layer 52. Again the term "intrinsic semiconductor" denotes a substantially pure semiconductor without any significant dopant species present. The number of charge carriers in the intrinsic semiconductor is determined by the properties of the material itself instead of the amount of impurities, i.e., dopants. Typically, in intrinsic semiconductors the number of excited electrons and the number of holes are equal (n=p). The front contact intrinsic amorphous semiconductor material layer 56 can serve to passivate the top surface of the absorption layer 52, and reduce electron-hole recombination. The front contact intrinsic amorphous semiconductor material layer 56 is typically, but not necessarily always hydrogenated. Typically, the front contact intrinsic amorphous semiconductor material layer 56 is composed of intrinsic hydrogenated amorphous silicon (i a-Si:H), hydrogenated amorphous Ge (a-Ge:H), or hydrogenated amorphous silicon germanium alloy (a-SiGe:H).

In some cases, the front contact intrinsic amorphous semiconductor material layer 56 comprises a same semiconductor material as the absorption layer. In other embodiments, the front contact intrinsic amorphous semiconductor material layer 56 has a lower valence band-offset than that of the absorption layer 52, and/or higher activated doping level(s) than that of doped hydrogenated amorphous silicon.

In cases in which the intrinsic layer includes SiGe, the Si (or Ge) content of the SiGe alloy may vary in a gradient fashion which, for instance, can increase or decrease from a surface of layer 56 that is nearest to the absorption layer 52 to a surface of layer 56 that is furthest from the absorption layer 52. The front contact intrinsic amorphous semiconductor material layer 56 can also include carbon, fluorine, deuterium, oxygen and/or nitrogen, which can be added during or after formation of the intrinsic amorphous semiconductor material layer 56.

Typically, the thickness of the front contact intrinsic amorphous semiconductor material layer 56 is from 3 nm to 30 nm, although lesser and greater thicknesses can also be employed.

The front contact intrinsic amorphous semiconductor material layer 56 is formed utilizing any chemical or physical growth process including any semiconductor precursor source material. In some embodiments, the intrinsic hydrogenated semiconductor containing material used in forming layer 56 is deposited in a process chamber containing a semiconductor precursor source gas and a carrier gas which may include hydrogen. Hydrogen atoms in the precursor and/or carrier gas are incorporated into the deposited material to form the front contact intrinsic amorphous semiconductor material layer 56. The front contact intrinsic amorphous semiconductor material layer 56 is optional, and may be omitted.

The front contact 54 shown in FIG. 4 also includes a front contact semiconductor material layer 58 of a second conductivity type that differs from the first conductivity type located either directly on the bottom surface of the absorption layer 52 or on a bottom surface of layer 56. The front contact semiconductor material layer 58 employed in this embodiment of the present disclosure has a lower valence band-offset that that of hydrogenated amorphous silicon with crystalline silicon, and/or a higher activated doping level than that of doped hydrogenated amorphous silicon. In this embodiment and when the absorption layer 52 is p-type, the front contact semiconductor material layer 58 has an n-type dopant concentration of from $10^{16}$ atoms/cm$^3$ to $10^{21}$ atoms/cm$^3$, with an n-type dopant concentration within the front contact semiconductor material layer 58 from $10^{18}$ atoms/cm$^3$ to $10^{20}$ atoms/cm$^3$ being more typical. The doping efficiency (i.e., the ratio of activated dopant atoms to the total dopant atoms) in layer 58 typically ranges from 0.1% to 20% although higher and lower doping efficiencies are possible. Typically, the doping efficiency is decreased by increasing the dopant atom concentration. In embodiments, in which the absorption layer 52 is n-type, the front contact semiconductor material layer 58 includes a p-type dopant concentration from $10^{16}$ atoms/cm$^3$ to $10^{21}$ atoms/cm$^3$, with a p-type dopant concentration within the front contact semiconductor material layer 58 from $10^{18}$ atoms/cm$^3$ to $10^{20}$ atoms/cm$^3$ being more typical. The doping efficiency (i.e., the ratio of activated dopant atoms to the total dopant atoms) in layer 58 typically ranges from 0.1% to 20% although higher and lower doping efficiencies are possible. Typically, the doping efficiency is decreased by increasing the dopant atom concentration.

In one embodiment, and when the absorption layer comprises Si, the front contact semiconductor material layer 58 can be comprised of Ge or a SiGe alloy. When a SiGe alloy is employed as front contact semiconductor material layer 58, the Si (or Ge) content may be constant throughout the entire thickness of the front contact semiconductor material layer 58. In other embodiments, the Si (or Ge) content of the SiGe alloy may vary in a gradient fashion which, for instance, can increase or decrease from a surface of the front contact semiconductor material layer 58 that is nearest to the absorption layer 52 to a surface of the front contact semiconductor material layer 58 that is furthest from the absorption layer 52.

The front contact semiconductor material layer 58 can be amorphous, nanocrystalline (i.e., microcrystalline) or polycrystalline. In some embodiments, front contact semiconductor material layer 58 can be hydrogenated. In other embodiments, the front contact semiconductor material layer 58 is not hydrogenated. The front contact semiconductor material layer 58 can also include carbon, fluorine, deuterium, oxygen and/or nitrogen, which can be added during or after formation of the front contact semiconductor material layer 58.

The front contact semiconductor material layer 58 can be formed utilizing any physical or chemical growth process that is well known to those skilled in the art. In one embodiment, the growth process includes an in-situ doped epitaxial growth process in which the dopant atom is introduced with the semiconductor precursor source material, e.g., a silane, during the formation of the front contact semiconductor material layer 58. In another embodiment, a growth process is used to form an undoped semiconductor layer, and thereafter the dopant can be introduced using one of ion implantation, gas phase doping, liquid solution spray/mist doping, and/or out-diffusion of a dopant atom from an overlying sacrificial dopant material layer that can be formed on the undoped semiconductor material, and removed after the out-diffusion process.

In some embodiments, the front contact semiconductor material layer 58 can be comprised of a hydrogenated semiconductor material. The hydrogenated semiconductor material that can be used as layer 58 can be deposited in a process chamber containing a semiconductor precursor source material gas and a carrier gas which may include hydrogen. Hydrogen atoms in the precursor and/or carrier gas are incorporated into the deposited material to form a hydrogenated semiconductor-containing material that can be used as layer 58.

The front contact 54 shown in FIG. 4 also includes a front contact transparent conductive material layer 60 located atop layer 58. The front contact transparent conductive material layer 60 can include one of the materials mentioned above for back contact transparent conductive material layer 20. The front contact transparent conductive material layer 60 can also be formed and having a thickness as mentioned also above for back contact transparent conductive material layer 20.

The optional front contact metal fingers 62 can be formed atop the front contact transparent conductive material layer 60 utilizing one of the techniques mentioned above.

Figure 6A:
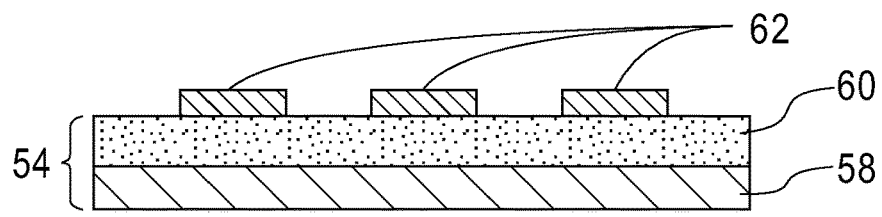
FIGS. 6A-6D are pictorial representations (through cross sectional views) depicting other front contact structure that can be used in place of the front contact illustrated in FIG. 4.

FIGS. 6A-6D depicting other front contact structures that can be used in place of the front contact 54 illustrated in FIG. 4. FIG. 6A provides a front contact structure that is similar to the front contact 54 shown in FIG. 4 except that front contact intrinsic amorphous semiconductor material layer 56 has been omitted from the structure.

Figure 6B:
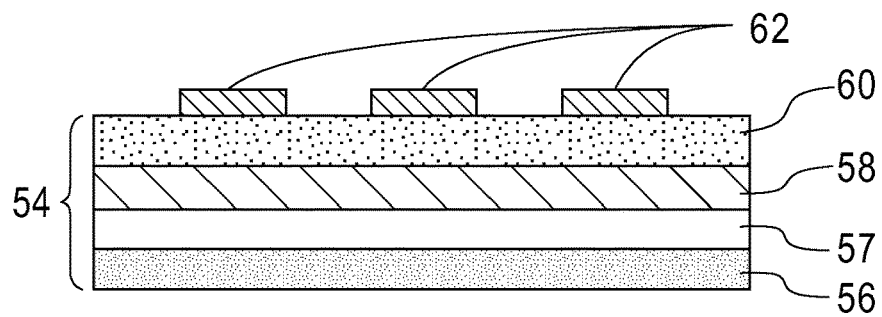

FIG. 6B illustrates an embodiment in which a front contact hydrogenated amorphous semiconductor material layer 57 of the second conductivity type is positioned between layers 56 and 58. Thus, when the absorption layer 52 comprises a p-type semiconductor material, the front contact hydrogenated amorphous semiconductor material layer 57 comprises n-type doping. In such an embodiment, the front contact hydrogenated amorphous semiconductor material layer 57 has an n-type dopant concentration ranging from $10^{16}$ atoms/cm$^3$ to $10^{21}$ atoms/cm$^3$, with concentration ranging from $10^{18}$ atoms/cm$^3$ to $10^{20}$ atoms/cm$^3$ being more typical. The doping efficiency (i.e., the ratio of activated dopant atoms to the total dopant atoms) in layer 57 typically ranges from 0.1% to 20% although higher and lower doping efficiencies are possible. Typically, the doping efficiency is decreased by increasing the dopant atom concentration. Likewise, when the absorption layer 52 comprises an n-type semiconductor material, the front contact hydrogenated amorphous semiconductor material layer 57 comprises p-type doping. In such an embodiment, the front contact hydrogenated amorphous semiconductor material layer 57 has a p-type dopant concentration ranging from $10^{16}$ atoms/cm$^3$ to $10^{21}$ atoms/cm$^3$, with concentration ranging from $10^{18}$ atoms/cm$^3$ to $10^{20}$ atoms/cm$^3$ being more typical. The doping efficiency (i.e., the ratio of activated dopant atoms to the total dopant atoms) in layer 57 typically ranges from 0.1% to 20% although higher and lower doping efficiencies are possible. Typically, the doping efficiency is decreased by increasing the dopant atom concentration.

The front contact hydrogenated amorphous semiconductor material layer 57 may or may not comprise the same semiconductor material as that of the absorption layer 52. In one embodiment in which the absorption layer 52 comprises Si, the front contact hydrogenated amorphous semiconductor material layer 57 comprises hydrogenated amorphous Si, and may contain carbon and/or germanium. The germanium and/or carbon concentration may be constant or vary across the layer.

The front contact hydrogenated amorphous semiconductor material layer 57 can be deposited in a process chamber containing a semiconductor precursor source material gas, first conductivity type dopant and a carrier gas, which may contain hydrogen. Hydrogen atoms in the precursor and/or carrier gas are incorporated into the deposited material.

The thickness of the front contact hydrogenated amorphous semiconductor material layer 57 may vary. Typically, the front contact hydrogenated amorphous semiconductor material layer 57 has a thickness from 2 nm to 15 nm, although lesser and greater thicknesses can also be employed.

Figure 6C:
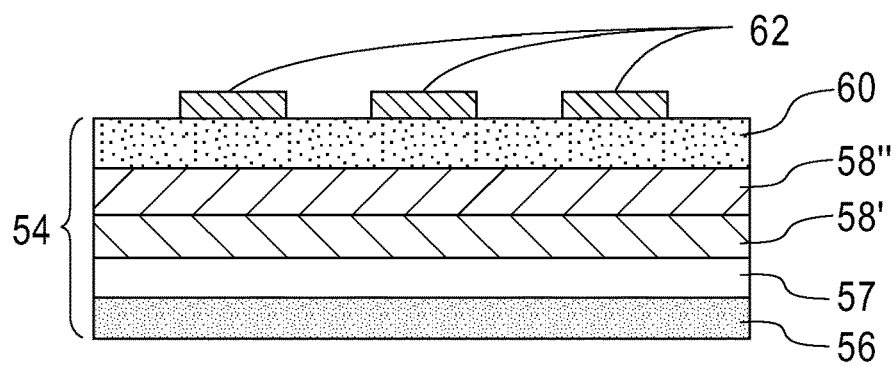
Figure 6D:
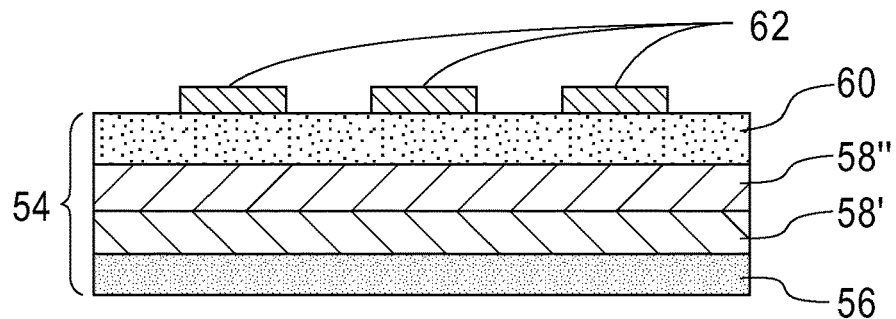

FIGS. 6C and 6D shows an embodiment in which front contact semiconductor material layer includes a first front contact semiconductor material layer 58' and a second front contact semiconductor material layer 58". In these embodiments, the first and second front contact semiconductor material layers 58', 58" are comprised of different semiconductor materials that both have the lower valence band-offset than that of hydrogenated amorphous silicon with the absorption layer 52, and/or higher activated doping level(s) than that of doped hydrogenated amorphous silicon. In one embodiment, the first front contact semiconductor material layer 58' is comprised of hydrogenated amorphous Ge and the second front contact semiconductor material layer 58" is comprised of hydrogenated amorphous SiGe.

It is noted that in each of FIGS. 4, 6A, 6B, 6C and 6D, the collection of holes at the front contact is improved by reducing the tunneling barrier for holes and/or enhancing the electric field at the emitter junction. This is due to the lower valance band-offset between the semiconductor material (s) within the front contact structure and crystalline Si, and/or higher activated doping level(s) of the semiconductor material(s) compared to that of doped hydrogenated amorphous Si.

The higher level(s) of activated doping may be due to (i) higher doping efficiency of at least one of the semiconductor materials within the front contact structure, and/or (ii) "transfer doping" (also known as "modulation doping") of at least one of the mentioned contact layer materials.

The following examples are provided to illustrate some embodiments of the present disclosure and to also illustrate some advantages that can be obtained therefrom.

EXAMPLE 1

In a first exemplary example shown in FIG. 7A, the emitter diffusion (n$^+$) layer was formed on the front side of a p-type crystalline Si substrate by phosphorous diffusion followed by a drive-in step using standard techniques which also formed a thermal oxide layer serving as anti-reflection coating (ARC). Metal fingers were formed after opening vias in the ARC using standard lithography. The back surface field was formed by plasma-enhanced chemical vapor deposition (PECVD) of a 5 nm/5 nm/15 nm i a-Si:H/p$^+$/a-Si:H/p$^+$/a-Ge:H stack at 200° C., followed by evaporation of an aluminum layer to form the back contact. In this exemplary embodiment, the c-Si substrate was not textured. The experimental output characteristics of the photovoltaic device measured under a light intensity of 1 sun is plotted in FIG. 7B, showing an open circuit voltage of 654 mV, a short circuit current density of 30.4 mA/cm$^2$, and a fill-factor of 80.7%. In some embodiments, either or both surfaces of the c-Si may be textured to enhance light trapping. In some embodiments, other metal layers may be used instead of Al. In some embodiments, a transparent conductive material may be inserted between the back contact metal and the a-Ge:H layer to enhance the reflection of light from the back surface of c-Si absorbing layer. In some embodiments, a patterned metal layer may be used instead of a blanket metal layer as the back contact. In some embodiments, the thickness of the i a-Si:H layer varies in the range of 0-10 nm, the thickness of the p$^+$ a-Si:H layer varies in the range of 3-25 nm, and the thickness of the p$^+$ a-Ge:H layer varies in the range of 3-50 nm. In some embodiments, the deposition temperature of the PECVD stack may vary from room temperature to 450° C. In some of these embodiments, some of the deposited layers may be nano-crystalline, micro-crystalline or poly-crystalline. In some embodiments, a thermal annealing step in the range of 100-600° C. is performed after or immediately after the deposition of the PECVD stack to recrystallize the a-Ge:H layer in the form of nano-crystalline, micro-crystalline, or poly-crystalline Ge, or improve the quality of a-Ge:H or a-Si:H layers without recrystallization. The a-Si:H layers may or may not recrystallize during this annealing step. In some embodiments where the back contact material is a metal such as Al, the recrystallization of the Ge layer may be facilitated by metal-induced crystallization. In an exemplary embodiment having the structure described for FIG. 7A, and the experimental output characteristics of FIG. 7B, annealing was performed in the range of 125-350° C., and as a result, the open circuit voltage was improved from 654 mV to 670 mV.

EXAMPLE 2

The front (emitter) contact in all the embodiments described in EXAMPLE 1 may be formed by depositing an i a-Si:H/n$^+$/a-Si:H PECVD stack instead of diffusion, followed by the deposition of a transparent conductive material and metal fingers. An exemplary structure with the described front contact and a back contact the same as that explained for FIG. 7A is illustrated in FIG. 7C. Open circuit voltages in the range of 703-763 mV were experimentally measured under an intensity of 1 sun on this exemplary structure after annealing in the range of 125-350° C. In other embodiments, annealing temperatures may be in the range of 100-600° C.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A photovoltaic device comprising:
an absorption layer consisting of a silicon-containing semiconductor layer of a first conductivity type and having a top surface and a bottom surface that opposes said top surface, wherein said silicon-containing layer of said absorption layer is selected from the group consisting of a crystalline Si-containing material and a multicrystalline Si-containing material;
a front contact located on said top surface of said absorption layer, wherein said front contact comprises an emitter diffusion layer of a second conductivity type that is opposite said first conductivity type and located directly on said top surface of said absorption layer, antireflective coating material portions located on portions of said emitter diffusion layer, and metal fingers located in between each antireflective coating material portion and contacting other portions of said emitter diffusion layer, wherein said metal fingers have a topmost surface that extends above a topmost surface of each antireflective coating material portion; and
a back contact located on said bottom surface of said absorption layer, wherein said back contact comprises:
an intrinsic hydrogenated amorphous semiconductor passivation layer of pure germanium located directly on said bottom surface of said absorption layer,
a doped hydrogenated amorphous Si-containing layer of said first conductivity type located directly on a bottom surface of said intrinsic hydrogenated amorphous semiconductor passivation layer,
a hydrogenated amorphous germanium containing layer of said first conductivity type located directly on a bottom surface of said doped hydrogenated amorphous Si-containing layer, and having a lower band-offset with said absorption layer than that of hydrogenated amorphous silicon with crystalline silicon, wherein said hydrogenated amorphous germanium containing layer is a silicon germanium alloy having a graded germanium or silicon content; and
a transparent conductive material layer located directly on a bottom surface of said hydrogenated amorphous germanium containing layer, wherein a bottom surface of said transparent conductive material layer is a bottom surface of said device.

2. The photovoltaic device of claim 1, wherein said silicon-containing semiconductor layer of said first conductivity type comprises crystalline or multi-crystalline silicon.

3. The photovoltaic device of claim 2, wherein said first conductivity type is p-type, and wherein said doped hydrogenated amorphous Si-containing layer and said hydrogenated amorphous germanium containing layer have a higher concentration of p-type dopants than said absorption layer.

4. The photovoltaic device of claim 1, wherein said SiGe alloy is nano/micro-crystalline or poly-crystalline.

5. The photovoltaic device of claim 1, wherein said first conductivity type is p-type, and wherein said doped hydrogenated amorphous Si-containing layer and said hydrogenated amorphous germanium containing layer have a higher concentration of p-type dopants than said absorption layer.

6. The photovoltaic device of claim 1, wherein said doped hydrogenated amorphous Si-containing layer and said hydrogenated amorphous germanium containing layer are of different composition.

7. The photovoltaic device of claim 6, wherein said doped hydrogenated amorphous Si-containing layer comprises a SiGe alloy.

8. The photovoltaic device of claim 1, wherein said germanium content is graded.

9. The photovoltaic device of claim 1, wherein said silicon content is graded.

10. The photovoltaic device of claim 1, wherein patterned metal portions are located on said hydrogenated amorphous germanium containing layer.

11. The photovoltaic device of claim 1, wherein said graded germanium or silicon content increases from a surface that directly contacts said bottom surface of said doped hydrogenated amorphous Si-containing layer to said bottom surface of said hydrogenated amorphous germanium containing layer that directly contacts said transparent conductive material layer.

12. The photovoltaic device of claim 1, wherein said graded germanium or silicon content decreases from a surface that directly contacts said bottom surface of said doped hydrogenated amorphous Si-containing layer to said bottom surface of said hydrogenated amorphous germanium containing layer that directly contacts said transparent conductive material layer.

* * * * *